United States Patent
Tek et al.

(10) Patent No.: US 7,590,170 B2
(45) Date of Patent: Sep. 15, 2009

(54) METHOD AND APPARATUS FOR MEASURING JITTER

(75) Inventors: Mehmet Nejat Tek, Quincy, MA (US); Chibling Liu, Northborough, MA (US)

(73) Assignee: Teradyne, Inc., Boston, MA (US)

( * ) Notice: Subject to any disclaimer, the term of this patent is extended or adjusted under 35 U.S.C. 154(b) by 847 days.

(21) Appl. No.: 10/954,032

(22) Filed: Sep. 29, 2004

(65) Prior Publication Data

US 2006/0067390 A1    Mar. 30, 2006

(51) Int. Cl.
| | |
|---|---|
| H04B 3/46 | (2006.01) |
| H04B 17/00 | (2006.01) |
| H04Q 1/20 | (2006.01) |
| G01R 31/28 | (2006.01) |
| G06F 11/00 | (2006.01) |
| H03M 13/00 | (2006.01) |

(52) U.S. Cl. .................. 375/226; 375/371; 375/240.27; 714/48; 714/701; 714/752; 714/761; 714/768; 702/69; 702/71; 702/189; 702/198

(58) Field of Classification Search ............. 702/67–71, 702/189, 198; 714/47–48, 55, 40–42, 701–707, 714/752–755, 761–762, 768, 764–765, 792, 714/795, 798; 375/240.26–240.27, 242–245, 375/253, 254, 262, 265, 354, 373, 376, 365–368, 375/362, 224–228, 371
See application file for complete search history.

(56) References Cited

U.S. PATENT DOCUMENTS

| | | | |
|---|---|---|---|
| 5,459,304 A  *  | 10/1995 | Eisenmann ................. | 235/380 |
| 5,886,906 A  *  | 3/1999 | Tatsumi et al. ................ | 703/14 |
| 6,298,315 B1 * | 10/2001 | Li et al. ....................... | 702/180 |
| 6,609,077 B1 | 8/2003 | Brown et al. | |
| 6,661,836 B1 | 12/2003 | Dalal et al. | |
| 6,694,462 B1 | 2/2004 | Reiss et al. | |
| 6,784,819 B2 | 8/2004 | Chow | |
| 6,873,338 B2 * | 3/2005 | Berstis ........................ | 345/596 |
| 6,931,335 B2 * | 8/2005 | Mueller ........................ | 702/69 |
| 7,016,805 B2 * | 3/2006 | Sun et al. .................... | 702/181 |
| 2002/0075714 A1 * | 6/2002 | Pereira et al. .................. | 365/49 |

(Continued)

OTHER PUBLICATIONS

Wavecrest SIA-3000, "Jitter Fundamentals,".

(Continued)

Primary Examiner—David C Payne
Assistant Examiner—Linda Wong
(74) Attorney, Agent, or Firm—Wolf, Greenfield & Sacks, P.C.

(57) ABSTRACT

A system and method for characterizing the jitter of a periodic signal. Samples of the signal are taken with a sampling device. A set of samples representing a particular value of the signal in multiple cycles of the periodic signal is collected. Those values are formed into a histogram. The histogram is matched to a probability distribution function. By identifying parameters that shape the probability distribution function to match the histogram of actual samples, characteristics of the jitter are determined. This technique may be employed as part of the calibration or verification of the jitter injection instrument such as might be used for testing semiconductor devices. Measurements may be made with a sampling device that is calibrated to NIST standards. In this way, the jitter measurements become NIST traceable.

20 Claims, 7 Drawing Sheets

U.S. PATENT DOCUMENTS

| | | | |
|---|---|---|---|
| 2002/0075951 A1 | 6/2002 | Pearson | |
| 2002/0097807 A1* | 7/2002 | Gerrits | 375/261 |
| 2002/0196510 A1 | 12/2002 | Hietala et al. | |
| 2003/0030612 A1* | 2/2003 | Yip et al. | 345/89 |
| 2004/0009794 A1* | 1/2004 | Proctor et al. | 455/575.7 |
| 2004/0117692 A1 | 6/2004 | Sweet | |
| 2004/0136479 A1 | 7/2004 | Miller | |
| 2004/0199842 A1 | 10/2004 | Sartschev | |
| 2004/0260492 A1 | 12/2004 | Halle et al. | |
| 2005/0069031 A1* | 3/2005 | Sunter et al. | 375/224 |
| 2005/0080574 A1* | 4/2005 | Draving | 702/69 |

OTHER PUBLICATIONS

International Search Report cited in PCT/US2005/034945, dated Jun. 13, 2006.

Wisetphanichkij et al., "Jitter Decomposition by Derivatived Gaussian Wavelet Transform" *International Symposium on Communications and Information Technologies 2004*, dated Oct. 26-29, 2004; pp. 1160-1165.

Ong et al., "Random Jitter Extraction Technique in a Multi-Gigahertz Signal," Proceedings of the *Design Automation and Test in European Conference*, IEEE, 2004, pp. 1-6.

Strassberg, D., "Does Lecroy Owe Its Big Win to Tektronix's 11th-Hour Pullout? You be the Judge in EDN's Hands-On, 6-GHz Shoot-Out" EDN, Feb. 6, 2003, pp. 45-50.

\* cited by examiner

METHOD AND APPARATUS FOR MEASURING JITTER

BACKGROUND OF INVENTION

1. Field of Invention

This invention relates generally to electronic test and measurement equipment and more specifically to the measurement of jitter.

2. Discussion of Related Art

Jitter is a characteristic of periodic signals that is often undesirable. If a signal is perfectly periodic, it will repeatedly take on the same value at points in time that are spaced by exactly the period of the signal. Jitter is the differences between the actual time at which the value recurs and the nominal times at which it should recur in a perfectly periodic signal.

Jitter might be introduced into a signal by many sources, including electrical interference that creates noise. Approximations in representing signal values and other errors in a circuit might all contribute to jitter.

Some amount of jitter is unavoidable in every signal. If the jitter is a relatively small fraction of the period of the signal, it is unlikely to impact the operation of electronic circuits that operate on the signal. However, some circuits are designed assuming that the signals they process have a specific period or take on specific values at defined times. If there is too much jitter in these signals, the circuits might fail to operate properly.

A desirable attribute of certain electronic components is the ability to operate even when input signals have jitter. Many standards for communication protocols such as IEEE 802.3ae for XAUI and 10G Ethernet impose requirements that can only be met if communication circuits operate in the presence of jitter. An engineer designing a communications system, for example, might wish to know the jitter immunity of a semiconductor device containing a receiver to determine whether the system will operate in compliance with the specification. To enable the engineer to make this determination the jitter immunity of the semiconductor device including the receiver must be known. Accordingly, some semiconductor devices are sold with a jitter specification that indicates how much jitter might be present on inputs to the device and still have the device operate as expected or the maximum amount of jitter the device might have on its output.

Jitter immunity of a semiconductor device can be characterized using automated test equipment. The test equipment includes a signal source that can be programmed to generate periodic signals with a programmable amount of jitter, i.e. a "jitter injector." The automated test equipment is generally constructed to determine whether a semiconductor device complies with applicable standards or otherwise operates as intended. During jitter characterization, jitter is intentionally introduced in a signal applied as a clock or other input to the device under test. The amount of jitter that causes the device to fail indicates its jitter immunity.

A similar setup can be used to test semiconductor devices as part of their production. The automated test equipment generates an input to the device under test with an amount of jitter equal to the specified jitter immunity of the device. If the device operates properly even with that level of jitter, it can be classified as a good device. Conversely, if it does not operate properly, the device might be rejected or "binned" as a part having a reduced jitter immunity specification.

For the characterization or test techniques above to be accurate, it is important that the jitter injector actually produces the exact amount of jitter it is programmed to produce. Periodically, the amount of jitter produced by a jitter injector might be measured and compared to the programmed amount. Such a process is known as verification.

Various methods to measure jitter are known, such as those specified in Annex 48B of the IEEE 802.3ae standard. For example, phase noise analyzers and real time oscilloscopes have been used to measure jitter. However, these devices often have limited bandwidth or frequency responses that make them unsuitable for high frequency measurements. However, jitter measurement is particularly important for very high frequency signals, such as those in the range of approximately 10 GHz.

Sampling oscilloscopes have also been used for jitter measurements. Sampling oscilloscopes generally have higher input bandwidth than a real time oscilloscope. The sampling oscilloscope might present the samples graphically as a waveform on a display or as a data file that can be processed in a computer or other data processing device.

It would be desirable to have more accurate jitter measurements techniques, particularly ones that are operable for measuring jitter on signals having a frequency between 1.5 and 12.5 GHz.

SUMMARY OF INVENTION

In one aspect, the invention relates to a method of characterizing jitter in a signal. The method involves obtaining a plurality of samples of the signal; forming a histogram of the sample values; fitting a probability distribution function to the histogram; and determining characteristics of the jitter from parameters of the probability distribution function fitting the histogram.

In some embodiments, the method of characterizing jitter in a signal is used to verify the performance of a programmable jitter injection device.

In another aspect, the invention relates to a method of verifying the performance of a programmable jitter injection device. The method includes programming the jitter injection device to generate a jitter modulated signal having a programmed amount of jitter, the jitter modulated signal being modulated according to a modulating function; forming a histogram of times of occurrence of a value of the jitter modulated signal; fitting a probability distribution function to the histogram, the probability distribution function having a component proportional to a probability distribution function of the modulating function and a component proportional to a probability distribution function of a random function; and characterizing jitter from the component proportional to a probability distribution function of the modulating function of the probability distribution function fit to the histogram.

In yet another aspect, the invention relates to a test system configured for providing a signal with a programmed amount of jitter in a signal. The test system includes a reference clock and a programmable jitter injection module. The programmable jitter injection module has a phase modulator having a modulation input, a signal input, and a modulated output, the modulated output being the signal input phase modulated by an amount proportional to the modulation input. The test system also includes a synthesizer circuit having an output generated from the reference clock and, the output of the synthesizer circuit is utilized as the signal input. The test system includes a sampling device receiving the modulated output and providing as an output a plurality of samples of the modulated output. A computer processor receives the plurality of samples of the modulated output and has a program associated therewith. The program controls the computer to analyze the samples by forming a histogram of sample values and fitting to the histogram a probability distribution function having at least one component representative of the probability distribution function of the modulation input.

BRIEF DESCRIPTION OF DRAWINGS

The accompanying drawings are not intended to be drawn to scale. In the drawings, each identical or nearly identical component that is illustrated in various figures is represented by a like numeral. For purposes of clarity, not every component may be labeled in every drawing. In the drawings.

DETAILED DESCRIPTION

This invention is not limited in its application to the details of construction and the arrangement of components set forth in the following description or illustrated in the drawings. The invention is capable of other embodiments and of being practiced or of being carried out in various ways. Also, the phraseology and terminology used herein is for the purpose of description and should not be regarded as limiting. The use of "including," "comprising," or "having," "containing," "involving," and variations thereof herein, is meant to encompass the items listed thereafter and equivalents thereof as well as additional items.

Figures 1A, 1B:
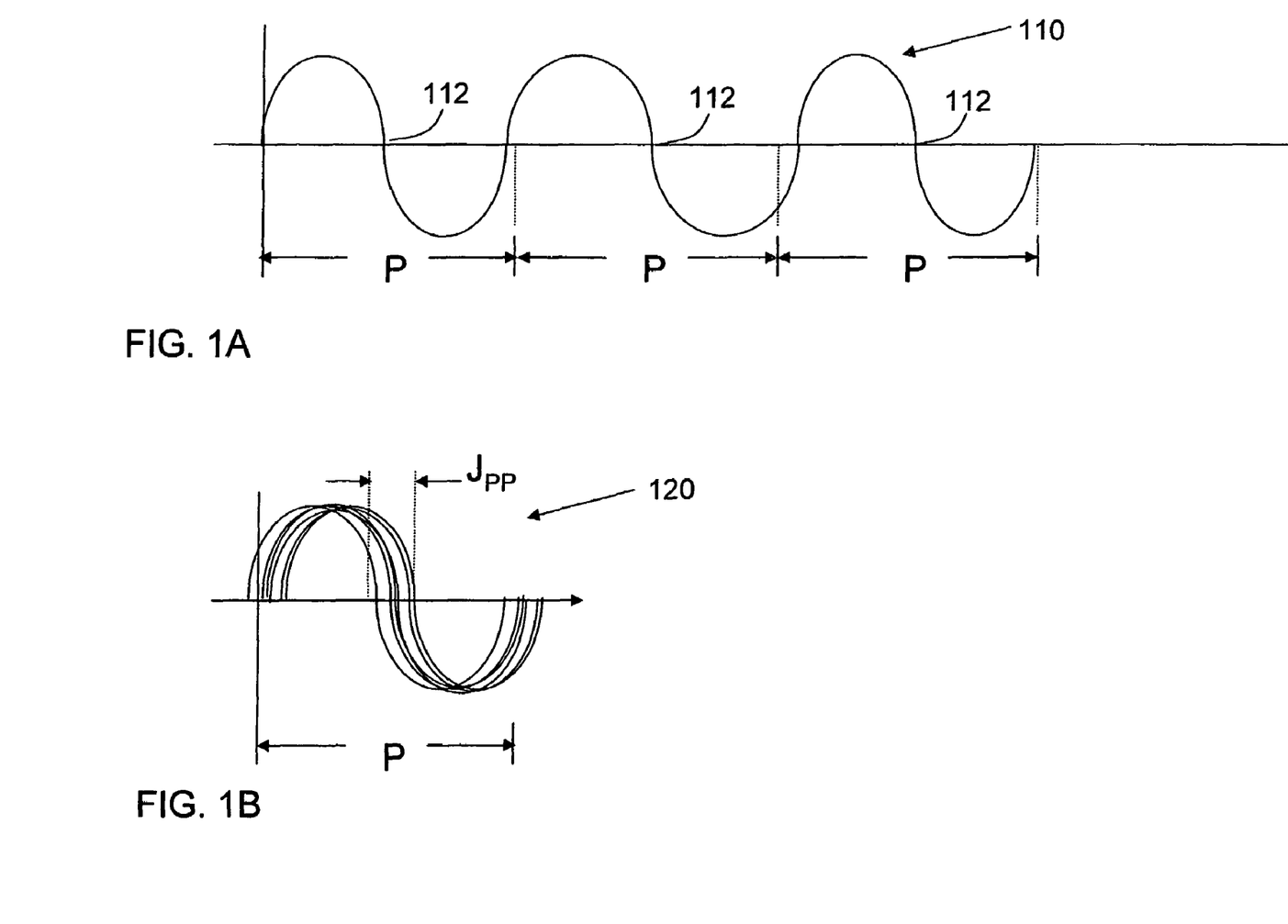
FIG. 1A and FIG. 1B are sketches useful in understanding jitter.

FIG. 1A is a sketch of a periodic signal 110. Signal 110 has a nominal period P, meaning that on average each cycle of the periodic signal 110 occurs in the time P. Signal 110 might, for example, be a sine wave. Signal 110 has a positive to negative zero crossing 112 that occurs once per cycle.

FIG. 1B illustrates a curve 120 formed by superimposing multiple cycles of the signal 110. Without jitter, each cycle would exactly align with the prior cycle and the superposition would appear as a single cycle of waveform 110. However, FIG. 1B illustrates the effect of jitter. For example, the zero crossings from the superposition of cycles creates a band of values during which a zero crossing might occur. This band of values is denoted $J_{PP}$. The boundaries of the band $J_{PP}$ represent the peak to peak value of the jitter in signal 110. To characterize the jitter on periodic signal 110, it is desirable to know the width of this band.

Figure 2:
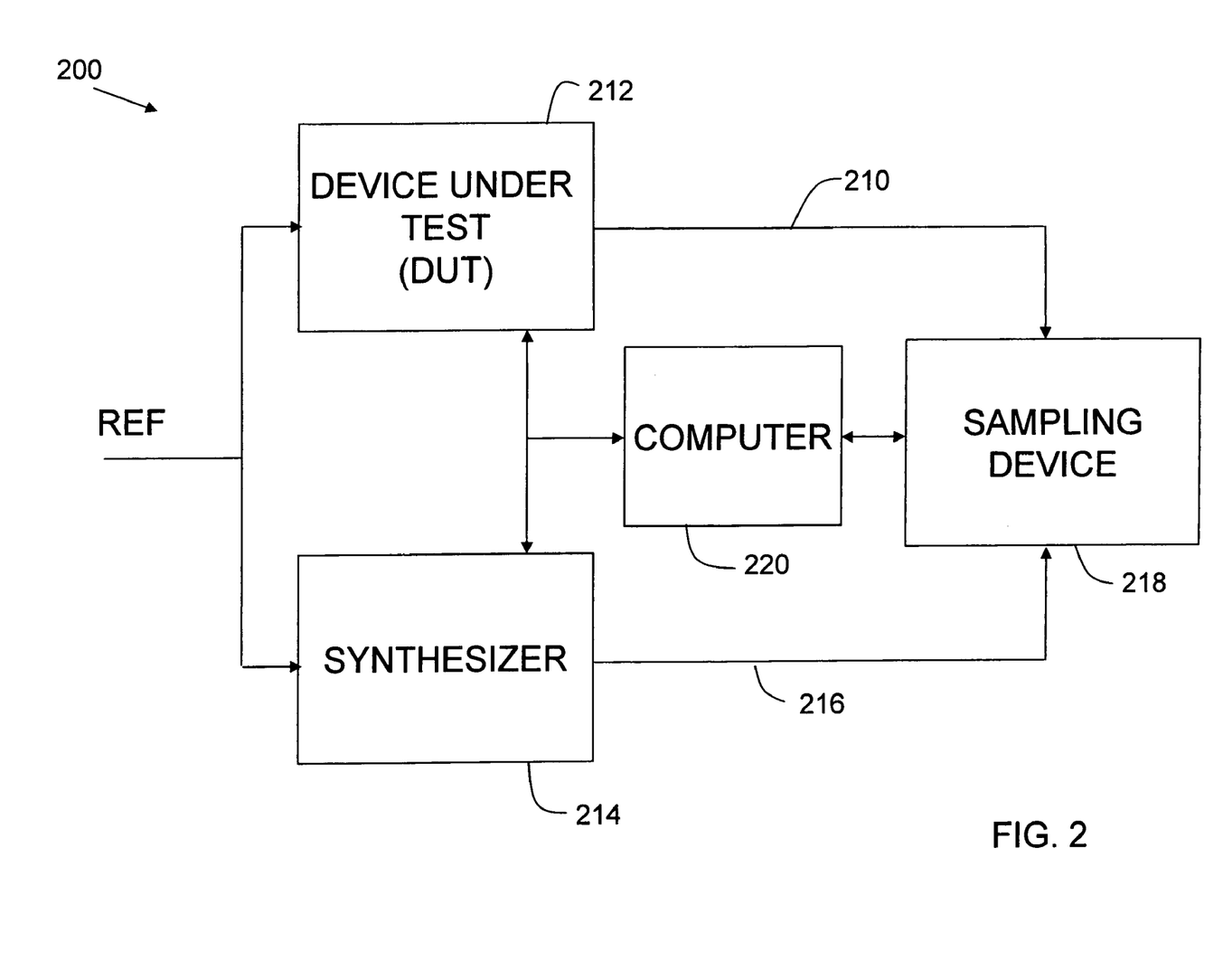
FIG. 2 is a block diagram of a test setup for measuring jitter.

FIG. 2 shows a block diagram of a test setup 200 for measuring jitter. In this example, Device Under Test (DUT) 212 is a device that generates a jitter modulated signal 210 with a programmable amount of jitter and might serve as a jitter injector in a test system. Test set up 200 might be used for verification of DUT 212 as a jitter injection device.

Synthesizer 214 generates a high frequency periodic signal 216. Synthesizer 214 might be any known synthesizer. Preferably synthesizer 214 will be a synthesizer that generates an output signal with high spectral purity and very low jitter. In a contemplated embodiment, the frequency of the output of synthesizer 214 is programmable over a large bandwidth, such as 1.5 GHz to 12.5 GHz.

Synthesizer 214 may be a synthesizer as known in the art. Such synthesizers typically contain phase locked loops (PLL's) and clock multiplying circuitry, which generates an output that is phase locked to the REF signal.

Signal 216 may be provided as an input to DUT 212. In the example of FIG. 2, DUT 212 includes a phase shift circuit that modulates the phase of periodic signal 216 in accordance with a control function. The change in phase from cycle to cycle of a periodic signal is a form of jitter. In this way, DUT 212 may introduce jitter onto periodic signal 216 to create a jitter modulated signal 210. However, DUT 212 more generally produces a phase modulated signal. The source of the signal to be modulated might be synthesizer 214, a synthesizer internal to DUT 212 or any other convenient source. Likewise, the control function that specifies the modulation could be derived from any convenient source.

In the examples that follow, jitter modulated signal 210 is modulated with a control function that is also a sine wave. Thus, jitter modulated signal 210 has sinusoidal jitter.

That control function may be generated within DUT 212. DUT 212 is shown to receive the reference clock signal, REF, which may drive a DDS circuit that generates a sinusoidal control function for a phase shifter inside DUT 212. By programming the DDS circuit within DUT 212, the jitter in jitter modulated signal 210 can be programmed.

Jitter modulated signal 210 is provided as one input to sampling device 218. Periodic signal 216 is provided as a trigger input to sampling device 218.

Test set up 200 is controlled by a computer 220. Computer 220 controls DUT 212 and synthesizer 214. Computer control of electronic devices is known in the art and is not described in detail. Computer 220 also controls sampling device 218 and receives data from sampling device 218, which it processes as described below.

Figure 3A:
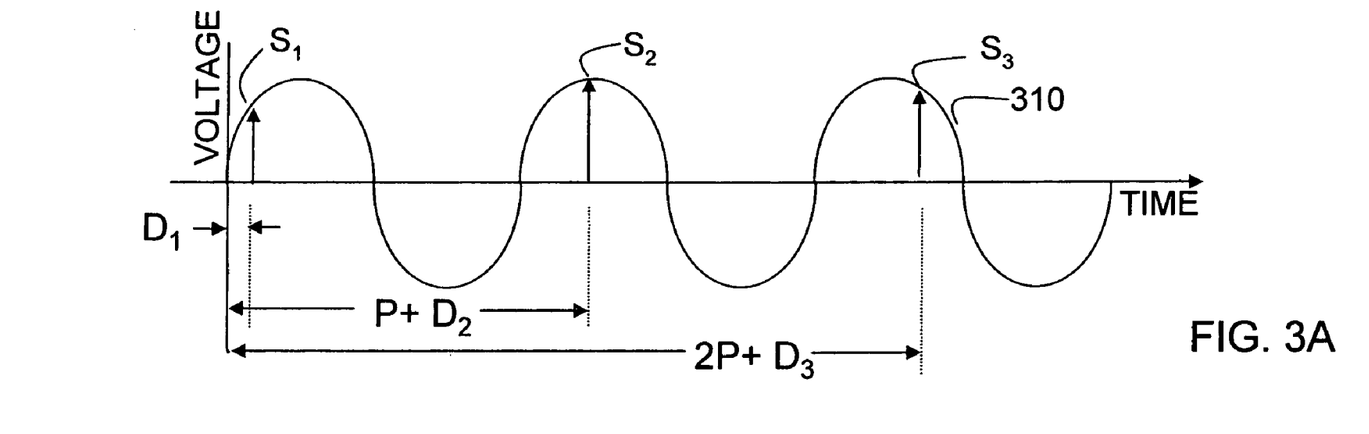
FIGS. 3A and 3B are sketches useful in understanding the operation of a sampling oscilloscope.

Sampling device 218 may be a sampling oscilloscope. FIG. 3A illustrates the operation of sampling oscilloscope that employs equivalent time sampling. Sampling oscilloscopes are known and are often used for taking multiple samples of periodic waveforms of very high frequency.

To operate effectively, a sampling oscilloscope requires a trigger signal that has a nominal period that is the same as or some multiple of the nominal period of the signals being measured. In the embodiment of FIG. 2, both periodic signal 216 and jitter modulated signal 210 are derived from the same reference clock, REF. This configuration provides the desired relationship between the trigger input and the input to sampling devices 218. The trigger signal is used to derive sample times. In the illustration of FIG. 3A, the sampling device 218 takes samples in multiple cycles of signal 310. The time of each sample relative to the start of each cycle may vary from cycle to cycle. Sample $S_1$ is taken a time $D_1$ into the first cycle. Sample $S_2$ is taken at time $D_2$ into the second cycle. Sample $S_3$ is taken a time $D_3$ into the third cycle. Preferably, the values $D_1$, $D_2$ and $D_3$ are different.

Figure 3B:
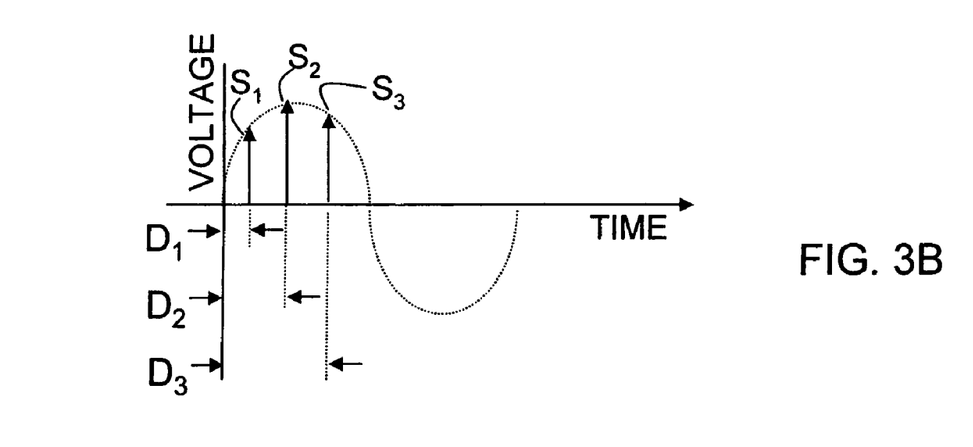

Reconstructing a cycle of the signal from the sample is illustrated in FIG. 3B. Each of the samples $S_1$, $S_2$ and $S_3$ represents points on the waveform that are offset from the start of the period by the delay, such as $D_1$, $D_2$, $D_3$, etc. associated with the sample. FIG. 3B shows these sample points plotted with the appropriate spacing relative to the start of the period.

FIG. 3B shows only three sample points for simplicity. To trace out a cycle of the waveform, numerous sample points would be employed. Each sample is spaced from the start of a period by a known amount, $D_N$. In an equivalent time oscilloscope, the trigger signal defines the start of the cycle in which a sample is to be taken. Circuitry within the oscilloscope causes a sample to be taken some delay $D_N$ after the trigger time. In most cases, the value $D_N$ varies randomly from sample to sample. In most cases, the $D_N$ will have a uniform distribution across the period of the waveform being sampled and sufficient samples will be taken to accurately represent one cycle of a waveform.

Acquiring more samples often leads to a more accurate measurement. However, acquiring more samples requires additional time for the measurement. In addition, if the signal being measured changes over the sample acquisition time, errors can be introduced in the measurement. In a contemplated embodiment, the phase locked loops within synthesizer 214 or DUT 212 may drift. Accordingly, the sample acquisition time is preferably less than about 30 seconds. In one contemplated embodiment, between 15,000 and 45,000 samples are collected. In one embodiment, about 30,000 samples are collected.

Figure 3C:
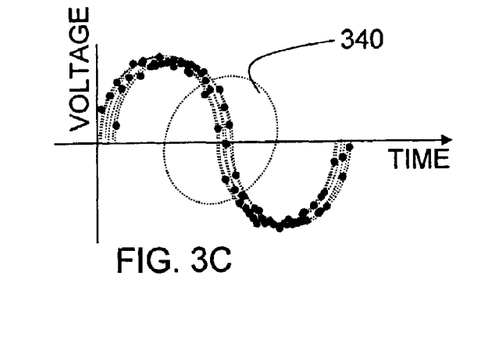
FIGS. 3C and 3D are sketches illustrating data collection using a sampling oscilloscope.

FIG. 3C illustrates multiple sample points collected using a sampling oscilloscope on a signal with jitter. The samples combine to generally trace out one cycle of the signal. The jitter causes the samples to fall in a band around the nominal value of the waveform. The samples may be analyzed to ascertain characteristics of jitter.

Figure 3D:
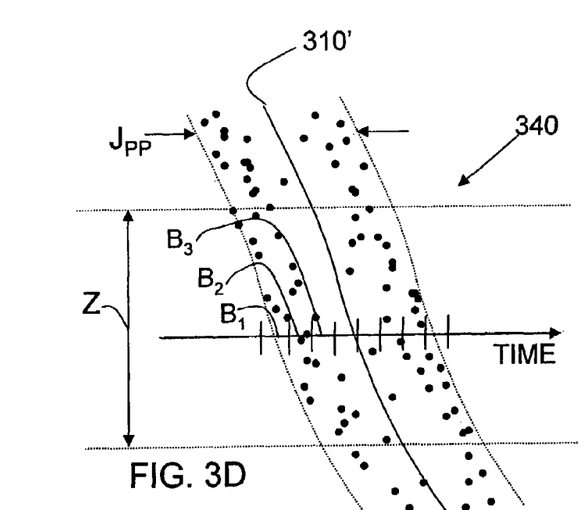

FIG. 3D shows an enlarged view of region 340 in FIG. 3C. Region 340 is the region around the zero crossing of jitter modulated signal 210. FIG. 3D shows that numerous samples fall within a band having a width $J_{PP}$, which is proportional to the magnitude of the jitter. The band surrounds a nominal signal location 310'.

The range Z represents a range of sample values (i.e., voltages) that are small enough to be considered to be essentially zero. The samples falling within the range Z represent zero crossings of the sampled signal.

Figure 3E:
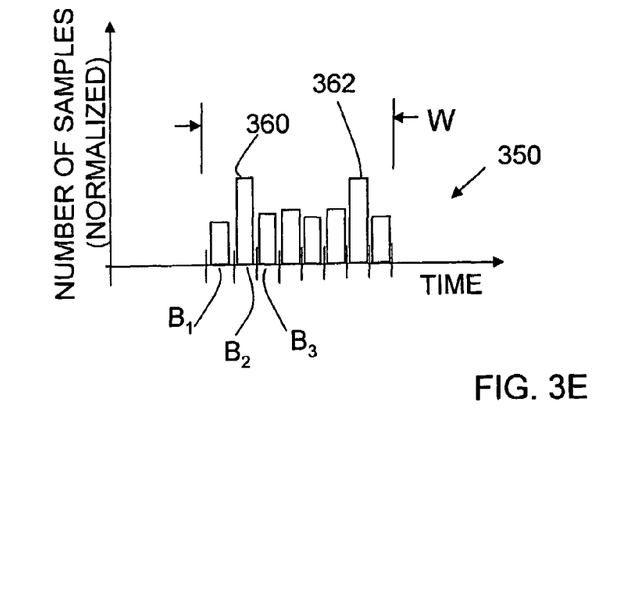
FIG. 3E is a sketch of a histogram of the samples in FIG. 3D.

Samples falling in range Z may be divided into bins, such as $B_1$, $B_2$, and $B_3$ FIG. 3E shows a histogram 350 created from the samples in region 340 shown in FIG. 3D. Histogram 350 is created by counting the number of samples within the range Z that fall within each of the bins such as $B_1$, $B_2$, $B_3$. The values in the histogram 350 may be normalized by the total number of samples used to create the histogram such that the histogram represents an approximation of the probability distribution function of the sample points in range Z. In this way, the histogram 350 can be taken to be the measured probability distribution function of the jitter on jitter modulated signal 210.

This measured probability distribution function can be used to derive characteristics of the jitter on jitter modulated signal 210 (FIG. 2). For example, the width W of the nonzero portion of histogram 350 might be taken as an estimate of the peak-to-peak value of the jitter. Some prior art systems have attempted to characterize jitter in this fashion. We have recognized however, that simply measuring the width of histogram 350 or the spacing between various features in the histogram such as peaks 360 and 362, provides inaccuracies in the characterization of the jitter. For example, such approaches do not account for other components of the jitter, such as might be caused by random noise. A method of using sampled values to more accurately determine jitter characteristics is presented below.

Figure 4A:
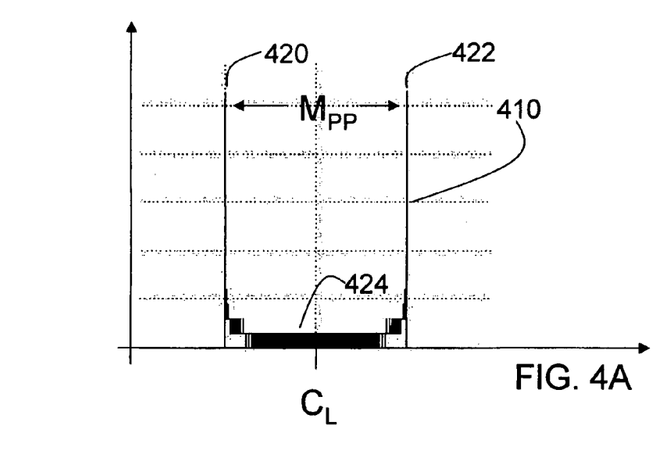
FIG. 4A is a sketch of a probability distribution function of the zero crossings of a signal that is modulated to provide sinusoidal jitter.

FIGS. 4A . . . 4F illustrate a method by which histogram data such as is represented by histogram 350 in FIG. 3E, can be used to more accurately characterize jitter. FIG. 4A represents a probability distribution function 410 for sample points made on a signal having sinusoidal jitter.

As described above, a signal modulated to have sinusoidal jitter is used as an example herein. For signals having jitter other than a sinusoidal jitter, the probability distribution function would be generated based on the applicable jitter modulation function. The probability distribution function might be derived from an expression representing the jitter modulation function. Alternatively, the probability distribution function might be derived numerically. A probability distribution function may be generated by plotting numerous points of a cycle of the jitter modulation function. Those samples would be divided into bins and the number of points falling in each bin could be counted and normalized.

FIG. 4A does not show individual bins for simplicity. Preferably, the probability distribution function 410 is computed with a relatively large number of bins such that it would appear nearly smooth as drawn in FIG. 4A. However, the resolution with which the probability distribution function 410 is represented is not a limitation on the invention.

FIG. 4A represents the general shape of the probability distribution function of any signal having sinusoidal jitter. However, characteristics of the function might vary depending on parameters of the sinusoidal modulation function. For example, the spacing $M_{PP}$ between the peaks 420 and 422 will vary depending on the magnitude of the sinusoid representing the jitter modulation function.

To characterize the jitter on jitter modulated signal 210, the idealized probability distribution function 410 might be "fitted" to the estimated probability distribution function represented by a histogram such as 350. The idealized probability distribution function is fitted to the measured histogram by identifying parameters of the idealized probability distribution function that create the best match to the measured histogram. These parameters can be used to characterize the measured jitter.

Histogram 350 (FIG. 3E) is a simplified histogram showing a relatively small number of bins. A much larger number of bins would preferably be used. Accordingly, a histogram such as 450 in FIG. 4D would preferably be used. In the scale shown, histogram 450 has a sufficient number of bins that it appears as a nearly continuous function.

Figure 4B:
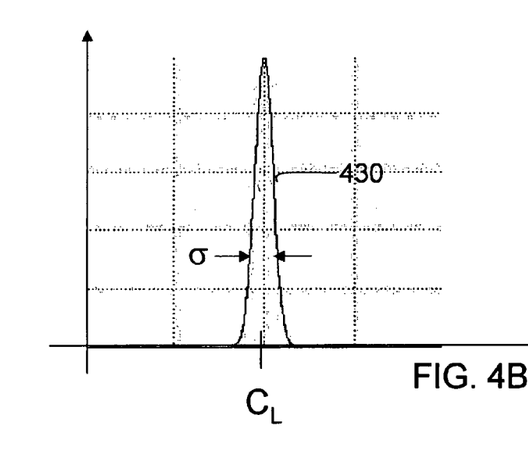
FIG. 4B is a sketch of a probability distribution function of the zero crossings of a signal that has random jitter.
Figure 4C:
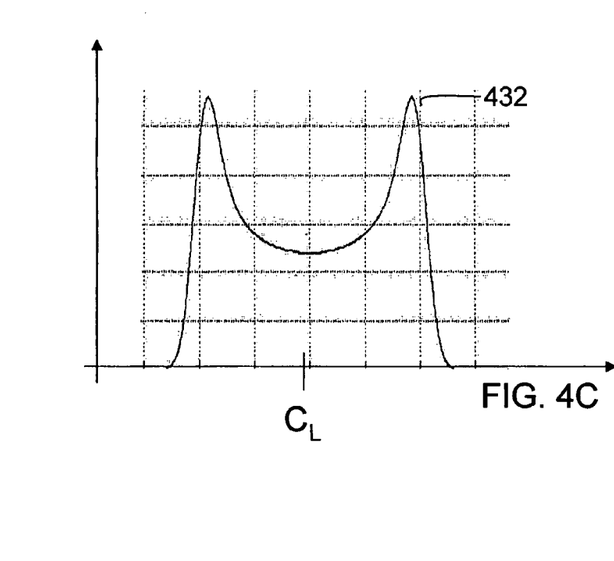
FIG. 4C is a sketch of a probability distribution function of the zero crossings of a signal that is modulated with sinusoidal jitter and random jitter.
Figure 4D:
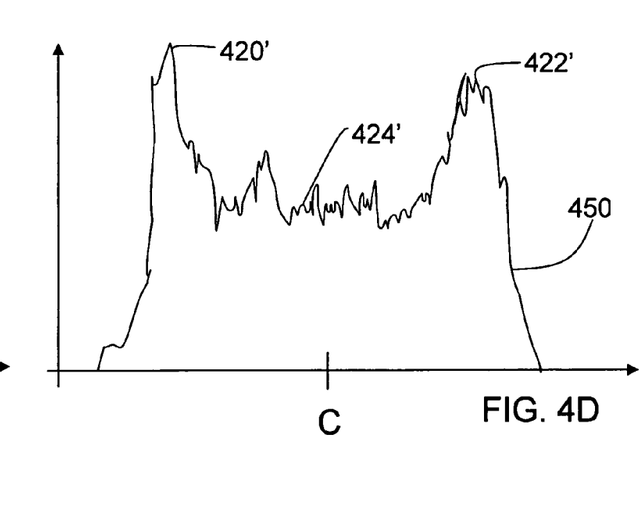
FIG. 4D is a sketch of a histogram of samples formed from zero crossing samples of a signal including sinusoidal jitter and random jitter.

As can be seen by comparing FIGS. 4A and 4D, the histogram 450 has generally the shape of the probability distribution function 410. It has peaks 420' and 422' and a trough 424', generally matching peaks 420 and 422 and trough 424 of FIG. 4A. However, histogram 450 is influenced by noise and other error sources because it is created from actual measurements. For this reason, simply measuring the peak-to-peak spread of the histogram or other single characteristic might not yield an accurate characterization of the jitter. Fitting an idealized probability distribution function, such as 410, to histogram 450 allows for a better estimate of jitter characteristics.

Even greater accuracy can be obtained by creating an idealized probability distribution function assuming the jitter on jitter modulated signal 210 has both a sinusoidal and a random component. FIG. 4B represents the probability distribution function of the zero crossings of a signal having random jitter. Probability distribution function 430 represents normal or Gaussian distributed jitter. Any signal having only Gaussian distributed jitter will have a probability distribution function 430 in the general shape of probability distribution function 430, regardless of the magnitude of that jitter. However, the width of the curve will vary depending on the standard deviation, σ, of that jitter.

Accordingly, a more accurate idealized probability distribution function 432 for jitter modulated signal 210 can be created by combining probability distribution functions 410 and 430. The probability distribution functions may be formed by convolving the individual probability distribution functions. To more accurately determine the characteristics of the jitter on jitter modulated signal 210, such a combined idealized probability distribution function might be fitted to the measured histogram 450.

Figure 4E:
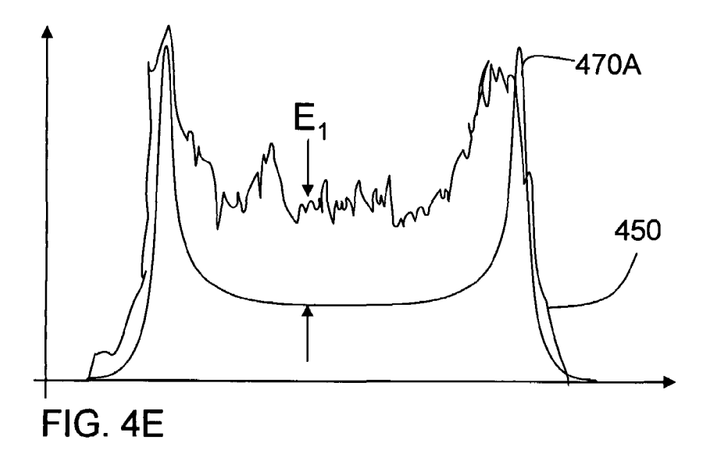
FIGS. 4E and 4F are sketches illustrating the process of fitting a probability distribution function to the histogram of FIG. 4D.
Figure 4F:
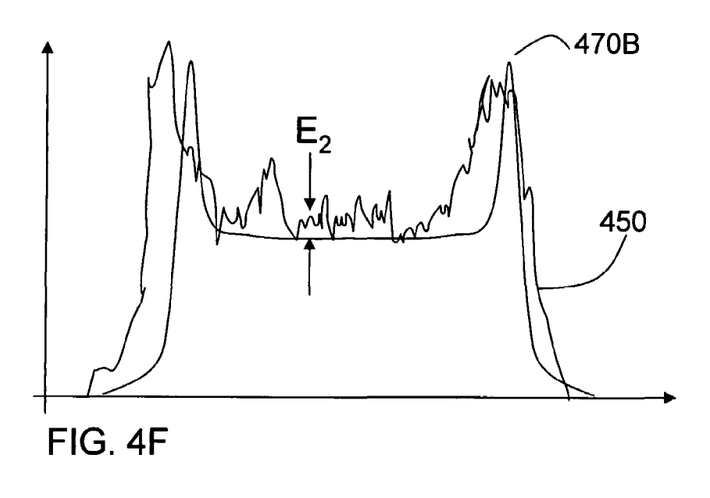

FIGS. 4E and 4F illustrate the curve fitting process. FIG. 4E shows a combined idealized probability distribution function 470A superimposed on histogram 450. Combined probability distribution function 470A is the convolution of a probability distribution function in the form of 410 and a probability distribution function in the form of 430, using specific values for $M_{PP}$ and σ.

A further parameter of probability distribution function 470A is its center point. As shown in FIGS. 4A and 4C, distribution functions 410 and 432 have a center point at the time $C_L$. Histogram 450 has a center point at time C. The time C might depend on specific times at which samples are taken by test setup 200. Such factors do not affect the shape of the histogram, but could affect the specific value around which it is centered. Thus, the center point of the idealized combined probability distribution function might be varied to create a better fit to histogram 450. The manner in which the center point is defined is not a limitation on the invention. The center point may be defined as the center of gravity. This metric has the advantage of indicating the expected value of the edge. However the center point may also be defined as the axis of symmetry or some other indication of the center.

FIG. 4F illustrates a combined probability distribution function 470B with different values of the standard deviation of the normal distributed jitter, peak value of the sinusoidal modulation and center point of the distribution functions.

The characteristics of the jitter are determined by selecting the idealized combined probability distribution function that best matches the measured histogram of values. In the example of FIG. 4E, there is an error $E_1$, between histogram 450 and combined probability distribution function 470A. The closeness of the match between probability distribution 470A and histogram 450 can be computed by summing the error value $E_1$ across all of the values in histogram 450. Likewise, FIG. 4F shows that there is an error $E_2$ between combined probability distribution function 470B and histogram 450. As can be seen, combined probability distribution function 470B has a smaller error $E_2$ and therefore represents a better match to histogram 450 than combined probability distribution function 470A.

Figure 5:
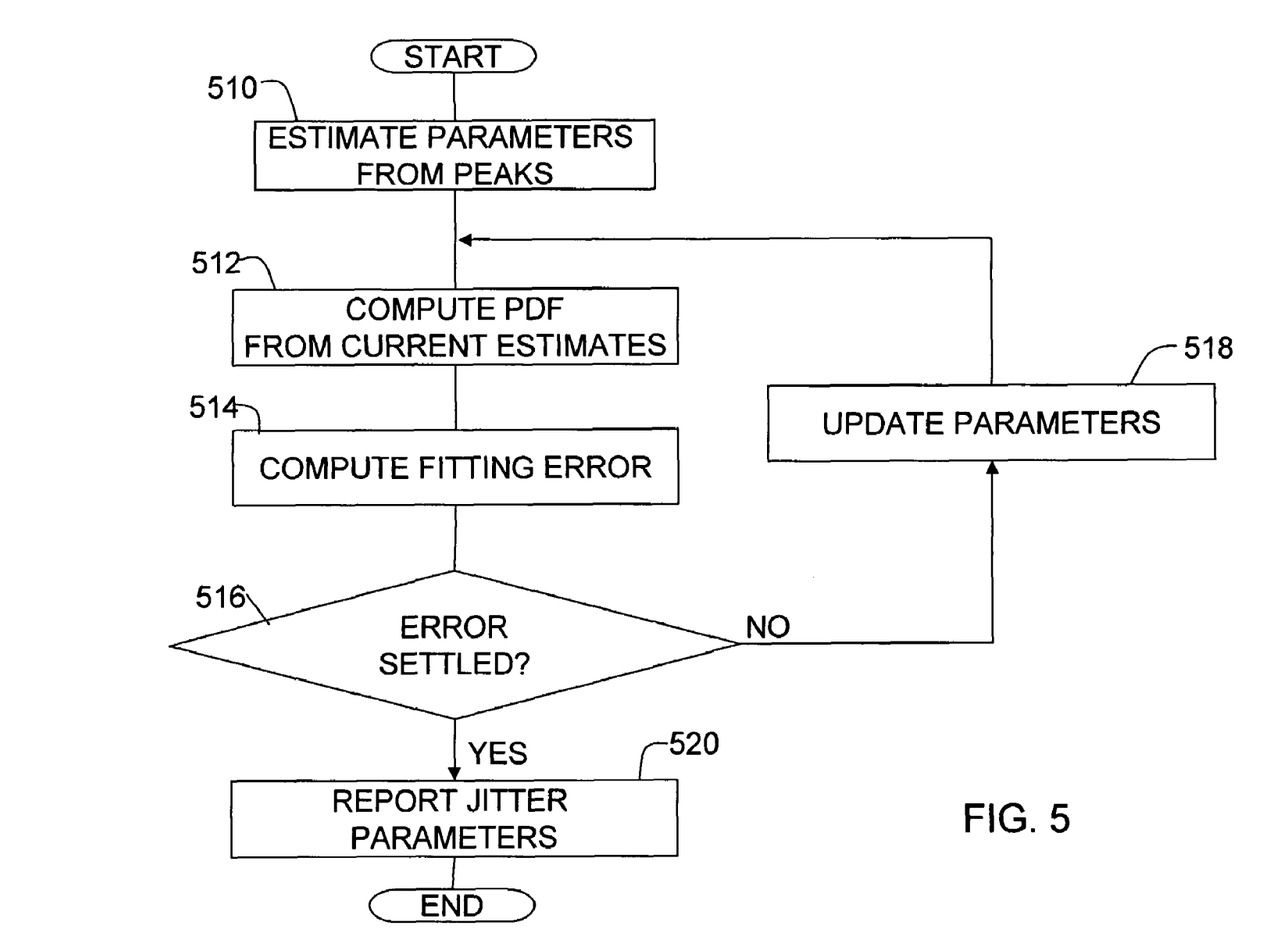
FIG. 5 is a flow chart illustrating the process of computing parameters that characterize jitter.

FIG. 5 is a flow chart illustrating the process by which the parameters of the jitter are computed. The process of FIG. 5 might, for example, be performed under control of software in computer 220 (FIG. 2). However, the process might be executed in any convenient manner.

The process of FIG. 5 begins at step 510. At step 510, an initial estimate of the parameters that characterize the probability distribution function 410 is made. The estimate may be based on techniques used in the prior art to estimate jitter. For example, the spacing between peaks 420' and 422' (FIG. 4B) might be used as an estimate of the peak-to-peak value $M_{PP}$ of the sinusoidal jitter. The midpoint between the peaks 420' and 422' might be taken as an initial estimate of the center point $C_L$. Further, the distance between the peak and the tail of the histogram closest to the peak divided by 6 might be used as an initial estimate of the standard deviation σ of the normal distributed jitter.

Once initial estimates of the parameters are determined, processing proceeds to step 512. At step 512, the combined probability distribution function that results from sampling a signal having jitter with the parameters estimated at step 510 is generated. This probability distribution function is formed by computing the probability distribution function corresponding to the sinusoidal component and the normal component. These functions are then convolved.

At step 514 the computed probability distribution function is compared to the measured histogram. The difference between the computed probability distribution function and measured histogram are represented as an error value. In one embodiment, the error value is computed according to a norm function. Various types of norm functions are known. For example, the error might be represented by computing the difference between the histogram and the computed probability distribution function on a point-by-point basis and summing the squares of each of the differences.

Once the error is computed, processing proceeds to step 516. At step 516 a check is made as to whether the error is reduced to a level that is deemed acceptable. The level of error might be deemed acceptable when if falls below a predetermined value. Alternatively, the level of error might be deemed acceptable when a minimum in the error function is detected. A minimum in the error function is identified when any change in the value of any parameter used to create the idealized probability distribution function results in a higher error.

If the error is not deemed settled, processing proceeds to step 518. At step 518, a new set of estimated parameters is determined. The process then repeats at step 512 where a new probability distribution function is computed. That new function is compared to the measured values at 514 and the error is again computed. If the new parameters do not meet the settling criteria, the process again repeats with new parameters being selected at step 518.

Finding parameters for a function that causes it to match another function is sometimes referred to as a "least squares estimation problem." Various methods for selecting parameters at step 518 to solve a least squares estimation problem are known. One such algorithm is referred to as the steepest decent algorithm, which is used in the illustrated embodiment.

Once the error is deemed to be settled, the process of FIG. 5 proceeds to step 520. The parameters of the combined idealized probability distribution function that fits the measured histogram 450 are used to characterize the jitter on the jitter modulated signal 210. In particular, these values give an accurate estimate of the peak to peak variation of the jitter modulation and also indicate the amount of random jitter introduced into the signal from other sources.

The process illustrated in FIG. 5 might, for example, be used in connection with a process of calibrating or verifying the operation of DUT 212. In the case where DUT 212 is a modulator, the modulator might be programmed to generate jitter of a certain characteristic. Test set up 200 (FIG. 2) might be used to obtain measurements on a signal 210 generated by the modulator. By characterizing the jitter according to the process of FIG. 5, a determination can be made as to whether the modulator is generating a signal with the programmed jitter characteristics. If the modulator does not generate the programmed amount of jitter, the modulator might be calibrated. One way to calibrate a modulator is to provide a data table that relates a program input to the actual amount of jitter produced in response to that program input value. As program inputs are applied to the modulator, the table could be accessed to identify the program input value necessary to produce the desired output of the modulator. This value would be substituted for the applied input.

Advantageously, the estimation technique depicted in FIG. 5 is more accurate than simple peak estimation techniques previously used.

As a further advantage, sampling device 218 may be calibrated relative to NIST standards for time measurement. In this way, the measurements made by sampling device 218 will be NIST traceable. If the measurements made by sampling device 218 are NIST traceable, the parameters characterizing jitter determined according to the process of FIG. 5 can also be deemed to be NIST traceable.

Having thus described several aspects of at least one embodiment of this invention, it is to be appreciated various alterations, modifications, and improvements will readily occur to those skilled in the art.

For example, the probability distribution function illustrated in FIG. 4A is appropriate for use in connection with a signal modulated with sinusoidal jitter. The same technique may be employed in connection with signals having other types of modulation by using a probability distribution function that would arise from a signal modulated with that type of jitter.

Likewise, the probability distribution function shown in FIG. 4B is appropriate for measuring jitter that has a Gaussian component. If the signal has a jitter component with different characteristics, a different form of probability distribution function may be used. If the signal has an additional jitter component with different characteristics, an additional form of probability distribution function may be used to compute the idealized probability distribution function.

Further, in the example above, the idealized combined probability distribution function was shown to have only two components, representing the programmed jitter and random jitter. If other sources of jitter are present on the signal under test, the idealized probability distribution function might have additional components representing those other sources of jitter.

Also, a sampling oscilloscope is used as an example of a sampling device in the set up of FIG. 2. Any convenient sampling device might be employed. Preferably the sampling device will be able to accurately sample signals in a wide frequency range. Preferably measurements will be made on signals up to at least 12.5 GHz.

Also, sampling device 218 was an equivalent time sampling device. While most high speed sampling devices currently available are equivalent time sampling devices, it is not necessary that samples be collected through equivalent time sampling. One alternative is under sampling.

As another example, FIG. 3D shows a band of values is selected around a zero crossing in the signal to be measured. The technique need not be limited to a sample set gathered around a zero crossing. Sample values taken around any point in the periodic waveform could be used.

Further, the method is described in connection with the characterization of an instrument used for jitter injection measurements. The method might be applied to measuring characteristics of jitter in other signals.

Also, probability distribution functions and histograms are depicted graphically. It is not necessary that these functions be presented as a graphical display or in a human perceptible form. The data processing described above might be performed through computerized manipulation of data.

Such alterations, modifications, and improvements are intended to be part of this disclosure, and are intended to be within the spirit and scope of the invention. Accordingly, the foregoing description and drawings are by way of example only.

What is claimed is:

1. A method of characterizing jitter in a signal, comprising:
    obtaining a plurality of samples of the signal;
    forming a histogram of the sample values;
    fitting a probability distribution function to the histogram, wherein fitting comprises providing a plurality of probability distribution functions, each characterized by a set of parameters, and identifying one of the plurality of probability distribution functions that differs from the histogram by the smallest amount, wherein identifying comprises computing for each of the plurality of probability distribution functions an error value representative of the differences between said probability distribution function and the histogram, and identifying the probability distribution function having the smallest error value; and
    determining characteristics of the jitter from parameters of the probability distribution function identified as fitting the histogram.

2. The method of characterizing jitter in a signal of claim 1 wherein the plurality of probability distribution functions are generated iteratively by varying parameters of the probability distribution function.

3. The method of characterizing jitter in a signal of claim 1 wherein computing an error value comprises computing an error value with a norm function.

4. The method of characterizing jitter in a signal of claim 1 wherein fitting a probability distribution function to the histogram comprises performing at least one of a least squares estimation, minimization and/or root finding of parameters of the probability distribution function.

5. The method of characterizing jitter in a signal of claim 1 wherein fitting a probability distribution function to the histogram comprises identifying values of a plurality of parameters of the probability distribution function.

6. The method of characterizing jitter in a signal of claim 5 wherein the probability distribution function comprises a combination of a probability distribution function of sinusoidal jitter and a probability distribution function of normal jitter and identifying values of a plurality of parameters comprises identifying values of the peak to peak deviation of the sinusoidal jitter and the standard deviation of the normal jitter.

7. The method of characterizing jitter in a signal of claim 1 wherein the signal is phase modulated according to a predetermined function and the probability distribution function comprises a combination of a probability distribution function of the predetermined function and a probability distribution function of random values.

8. The method of characterizing jitter in a signal of claim 1 wherein fitting a probability distribution function to a histogram comprises fitting a probability distribution function that represents the convolution of the probability distribution functions of two jitter components.

9. The method of characterizing jitter in a signal of claim 1 wherein obtaining a plurality of samples of the signal comprises under sampling or equivalent time sampling the signal.

10. The method of characterizing jitter in a signal of claim 1 wherein each of the sample values has a magnitude and a time associated with it and forming a histogram of sample values comprises forming a histogram of the times associated with samples having values in a predetermined range.

11. A method of verifying the performance of a programmable jitter injection device, comprising:
programming the jitter injection device to generate a signal having a programmed amount of jitter;
characterizing jitter in the signal according to the method of claim 1 to obtain characteristics of the signal; and
determining, from the characteristics of the signal, whether the generated signal contains the programmed amount of jitter.

12. The method of verifying the performance of a programmable jitter injection device of claim 11 wherein:
programming the jitter injection device to generate a signal having a desired amount of jitter comprises specifying a phase modulation function; and
fitting a probability distribution function to the histogram comprises fitting to the histogram a probability distribution function with a probability distribution matching the phase modulation function.

13. The method of verifying the performance of a programmable jitter injection device of claim 11 wherein the signal has a frequency above 10 GHz.

14. A method of verifying the performance of a programmable jitter injection device, comprising:
a) programming the jitter injection device to generate a jitter modulated signal having a programmed amount of jitter, the jitter modulated signal being modulated according to a modulating function;
b) forming a histogram of times of occurrence of a value of the jitter modulated signal;
c) fitting a probability distribution function to the histogram, the probability distribution function having a component proportional to a probability distribution function of the modulating function and a component proportional to a probability distribution function of a random function, wherein fining comprises providing a plurality of probability distribution functions, each characterized by a set of parameters, and identifying one of the plurality of probability distribution functions that differs from the histogram by the smallest amount, wherein identifying comprises computing for each of the plurality of probability distribution functions an error value representative of the differences between said probability distribution function and the histogram, and identifying the probability distribution function having the smallest error value; and
d) characterizing jitter from the component proportional to a probability distribution function of the modulating function of the probability distribution function identified as fining the histogram.

15. The method of verifying the performance of a programmable jitter injection device of claim 14 wherein the modulating function is a sinusoid and the random function is a Gaussian function.

16. The method of verifying the performance of a programmable jitter injection device of claim 14 wherein forming a histogram of times of occurrence of a value comprises:
sampling the jitter modulated signal;
selecting samples having values in a band around the value;
dividing the selected samples into bins.

17. The method of verifying the performance of a programmable jitter injection device of claim 14, additionally comprising:
changing the programmed characteristics of the jitter modulated signal and repeating steps b) to d).

18. A test system configured for providing a signal with a programmed amount of jitter in a signal, the test system comprising:
a reference clock;
a programmable jitter injection module comprising:
a phase modulator having a modulation input a signal input, and a modulated output, the modulated output being the signal input phase modulated by an amount proportional to the modulation input;
a synthesizer circuit having an output generated from the reference clock, the output of the synthesizer circuit utilized as the signal input;
a sampling device receiving the modulated output and providing as an output a plurality of samples of the modulated output;
a computer processor receiving the plurality of samples of the modulated output, the computer processor having a program associated therewith, the program controlling the computer to analyze the samples by forming a histogram of sample values and fitting to the histogram a probability distribution function having at least one component representative of the probability distribution function of the modulation input, wherein fitting comprises providing a plurality of probability distribution functions, each characterized by a set of parameters, and identifying one of the plurality of probability distribution functions that differs from the histogram by the smallest amount, wherein identifying comprises computing for each of the plurality of probability distribution functions an error value representative of the differences between said probability distribution function and the histogram, and identifying the probability distribution function having the smallest error value.

19. The test system of claim 18 wherein the program controlling the computer processor to analyze the samples comprises controlling the computer to fit to the histogram to a probability distribution function having at least two components comprising the probability distribution function of the modulation input and the probability distribution function of a source of random jitter.

20. The test system of claim 18 wherein the sampling device collects between 15,000 and 45,000 samples.

* * * * *